United States Patent
Bazarjani et al.

(10) Patent No.: US 6,472,747 B2
(45) Date of Patent: Oct. 29, 2002

(54) MIXED ANALOG AND DIGITAL INTEGRATED CIRCUITS

(75) Inventors: Seyfollah Bazarjani; Haitao Zhang, both of San Diego; Qiuzhen Zou, La Jolla; Sanjay Jha, San Diego, all of CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/798,198

(22) Filed: Mar. 2, 2001

(65) Prior Publication Data

US 2002/0121679 A1 Sep. 5, 2002

(51) Int. Cl.[7] ............................................. H01L 23/34
(52) U.S. Cl. .................. 257/724; 257/738; 257/777; 257/784; 257/786; 361/735; 361/760; 361/783
(58) Field of Search ................... 257/686, 723, 257/724, 725, 738, 777, 784, 786, 737, 780; 361/735, 760, 783

(56) References Cited

U.S. PATENT DOCUMENTS

| | | | |
|---|---|---|---|
| 5,422,435 A | * 6/1995 | Takiar et al. ............... 257/686 |
| 5,506,851 A | 4/1996 | Fuse ........................ 371/22.1 |
| 5,723,906 A | * 3/1998 | Rush ........................ 257/723 |
| 5,969,562 A | 10/1999 | Barr ......................... 327/319 |
| 6,014,586 A | * 1/2000 | Weinberg et al. .......... 257/686 |
| 6,057,598 A | * 5/2000 | Payne et al. ................ 257/723 |
| 6,229,227 B1 | * 5/2001 | Muthukumaraswamy et al. ........................................... 307/38 |
| 6,369,448 B1 | * 4/2002 | McCormick ................ 257/777 |

FOREIGN PATENT DOCUMENTS

| | | | |
|---|---|---|---|
| JP | 59-143354 | * | 8/1984 |
| JP | 5-82717 | * | 4/1993 |
| JP | 5-145021 | * | 6/1993 |
| JP | 2001-185676 | * | 7/2001 |

* cited by examiner

Primary Examiner—David L. Talbott
Assistant Examiner—Alonzo Chambliss
(74) Attorney, Agent, or Firm—Philip R. Wadsworth; Charles D. Brown; George C. Poppas

(57) ABSTRACT

Techniques for fabricating analog and digital circuits on separate dies and stacking and integrating the dies within a single package to form a mixed-signal IC that provides many benefits. In one aspect, the analog and digital circuits are implemented on two separate dies using possibly different IC processes suitable for these different types of circuits. The analog and digital dies are thereafter integrated (stacked) and encapsulated within the single package. Bonding pads are provided to interconnect the dies and to connect the dies to external pins. The bonding pads may be located and arranged in a manner to provide the required connectivity while minimizing the amount of die area required to implement the pads. In another aspect, the die-to-die connectivity may be tested in conjunction with a serial bus interface.

33 Claims, 4 Drawing Sheets

Die-to-substrate bonding

Die-to-die bonding

MIXED ANALOG AND DIGITAL INTEGRATED CIRCUITS

BACKGROUND

1. Field

The present invention relates generally to circuits, and more specifically to techniques for fabricating analog and digital circuits on separate dies and stacking and integrating the dies into a single package.

2. Background

Many applications require both analog and digital signal processing. One such application is in the area of wireless communication, where mixed analog and digital signal processing is required on both the transmit and receive sides. On the receive side, a modulated analog signal (typically at radio frequency) is received, conditioned (e.g., amplified and filtered), downconverted, quadrature demodulated, and digitized to provide samples. Digital signal processing is then performed on the samples to recover the transmitted data. And on the transmit side, data is processed (e.g., encoded, interleaved, and spread) and then converted to one or more analog signals. The analog signals are then conditioned, modulated, and upconverted to provide a modulated signal suitable for transmission over a wireless link. Mixed signal circuits may also be used for other aspects of wireless communication, and include voice/audio coder/decoder, general-purpose analog-to-digital converters (ADCs) to digitize various signals such as battery voltage and temperature, and other circuits. Mixed-signal processing is also required for many other applications such as networking, computer, and others.

Conventionally, analog and digital signal processing is achieved via separate analog and digital integrated circuits (ICs), with the interface between the two ICs achieved via ADCs and digital-to-analog converters (DACs). Digital circuits tend to generate large amounts of switching noise. In contrast, analog circuits typically include various sensitive circuits (e.g., oscillator, amplifier, and so on) that prefer, or are required, to operate in a quite environment. Implementation of analog and digital circuits on separate ICs allows these circuits to be isolated and operated in their preferred environments. Moreover, the optimum process technologies for analog and digital circuits are typically different. Digital circuits are often implemented using standard CMOS process, whereas analog circuits may utilize linear capacitors and resistors that require extra processing steps to be added to the standard CMOS process.

To reduce cost and complexity of a product, both analog and digital circuits may be fabricated on a common substrate in a mixed-signal IC. The mixed-signal IC provides numerous benefits such as reduced cost, fewer component count, smaller required board area, simplified testing, and possibly other benefits.

However, the fabrication of the analog and digital circuits on a common substrate has some disadvantages. First, the noise generated by the digital circuits degrades the performance of the analog circuits via coupling through the substrate. Second, the analog circuits may require linear capacitors and resistors, which may then dictate the need for a particular IC process, such as analog CMOS. Thus, although the analog circuits may occupy only a small portion of the die, the cost of the digital circuits increases as a consequence of the IC process selected for the analog circuits. Third, digital circuits typically benefit from technology scaling (e.g., reduction in transistor sizes, lower operating voltages) whereas analog circuits may suffer from voltage scaling. And fourth, the design cycle of a mixed-signal IC may be prolonged because the design cycle for analog circuits is typically much longer than that for digital circuits.

As can be seen, there is a need in the art for techniques to fabricate and integrate analog and digital circuits such that the benefits of mixed-signal ICs can be attained while the disadvantages of conventional mixed-signal ICs fabricated on a common substrate are minimized.

SUMMARY

Aspects of the invention provide techniques for fabricating analog and digital circuits on separate dies and stacking and integrating the dies within a single package to form a mixed-signal IC that provides many of the above-described benefits. In one aspect, the analog and digital circuits are implemented on two separate dies using possibly different IC processes suitable for these different types of circuits. The analog and digital dies are thereafter integrated (stacked) and encapsulated within the single package. Bonding pads are provided to interconnect the two dies and to connect the dies to external pins. The bonding pads may be located and arranged in a manner to provide the required connectivity while minimizing the amount of die area required to implement the pads. In another aspect, the die-to-die connectivity may be tested in conjunction with a serial bus interface. In yet another aspect, the power supplies provided to some or all of the circuits within the analog die (and possibly the power supplies provided to some or all blocks in the digital die) may be collapsed (e.g., brought down to zero Volt) during a stand-by mode to extend operating.

The invention further provides integrated circuits, methods, and elements that implement various aspects, embodiments, and features of the invention, as described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Aspects of the invention provide techniques for fabricating analog and digital circuits on separate dies and stacking the dies to fit within a single package. The mixed-signal IC of the invention provides many of the benefits of a mixed-signal IC while minimizes the disadvantages of a conventional mixed-signal IC fabricated on a common substrate. In one aspect, the analog and digital circuits are implemented on two separate dies using IC processes suitable for these circuits. For example, the digital circuits may be implemented using advanced low-voltage digital CMOS technologies to save cost, power consumption, and silicon area. Depending on the required performance, the analog circuits may be designed and implemented using low-cost, mature analog CMOS technologies to save power consumption, or may be designed using high performance technologies. The analog and digital dies are thereafter integrated (stacked) and encapsulated within a single package, as described in further detail below.

Figure 1:
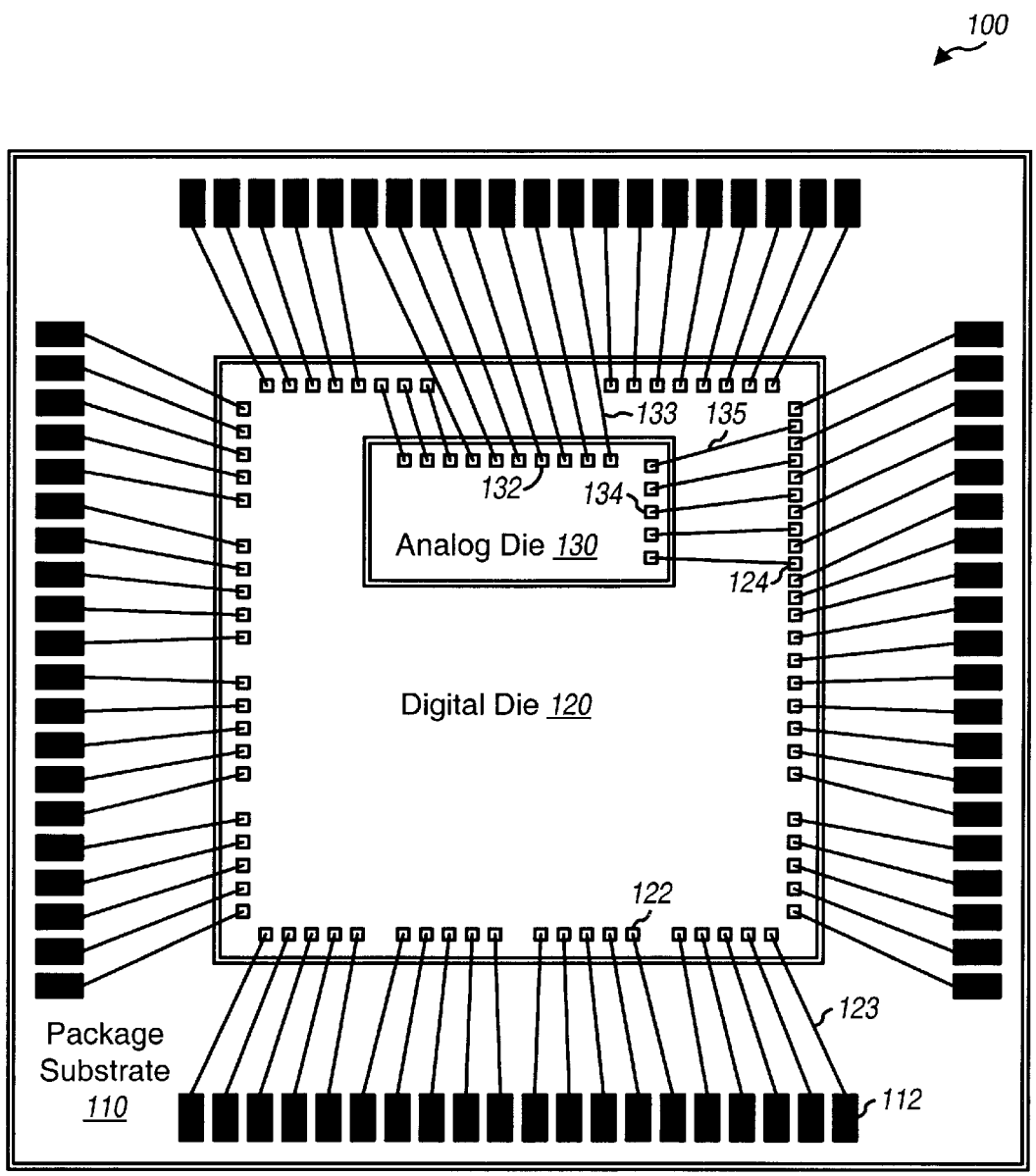
FIG. 1 is a diagram showing a top view of a mixed-signal IC, in accordance with an embodiment of the invention.

FIG. 1 is a diagram showing a top view of a mixed-signal IC 100, in accordance with an embodiment of the invention. Mixed-signal IC 100 comprises an analog die 130 stacked on top of a digital die 120, which is further stacked on top of a package substrate 110. For many applications, the analog die is only a fraction (e.g., typically ⅛ to ¼) of the size of the digital die. For example, analog die 130 may have a dimension of 1.5 mm by 2 mm, and digital die 120 may have a dimension of 6 mm by 6 mm. Thus, the smaller analog die may be stacked on top of the digital die to save space and to allow for use of a smaller package.

The analog and digital dies may have any shape and dimension. For some circuits and IC processes, a certain aspect ratio for the dies may be preferred. For example, a square die may be preferable because of ease in manufacturing and other benefits.

As shown in FIG. 1, a number of bonding pads 112 are provided on four sides of package substrate 110. These bonding pads 112 may be used to provide input/output (I/O) for the analog and digital dies. Digital die 120 also includes a number of bonding pads 122 that may be interconnected via bond wires 123 to corresponding bonding pads 112 on package substrate 110. Similarly, analog die 130 includes a number of bonding pads 132 that may be interconnected via bond wires 133 to corresponding bonding pads 112 on package substrate 110. Analog die 130 further includes a number of bonding pads 134 that may be interconnected via bond wires 135 to corresponding bonding pads 124 on digital die 120.

Various factors may be considered in selecting the particular area of digital die 120 over which to place analog die 130. Improved performance may be achieved if analog die 130 is placed over a more quite area of digital die 120. Analog die 130 may also be preferably placed over sections of digital die 120 less likely to required debug. For example, digital die 120 may include a section for memory circuits (e.g., RAM and/or ROM), which may be more prone to circuit defects and are more likely to require access to debug the circuits. In that case, analog die 130 may be placed over another area of digital die 120 that is less likely to require access. Analog die 130 may also be placed near an edge or a corner of digital die 120. This may shorten the interconnection (i.e., the bond wires) between bonding pads 132 on analog die 130 and the corresponding bonding pads 112 on package substrate 110. Analog die 130 may also be placed based on the pin out of the analog die and the overall package. Various other factors may also be considered and are within the scope of the invention.

Figure 2:
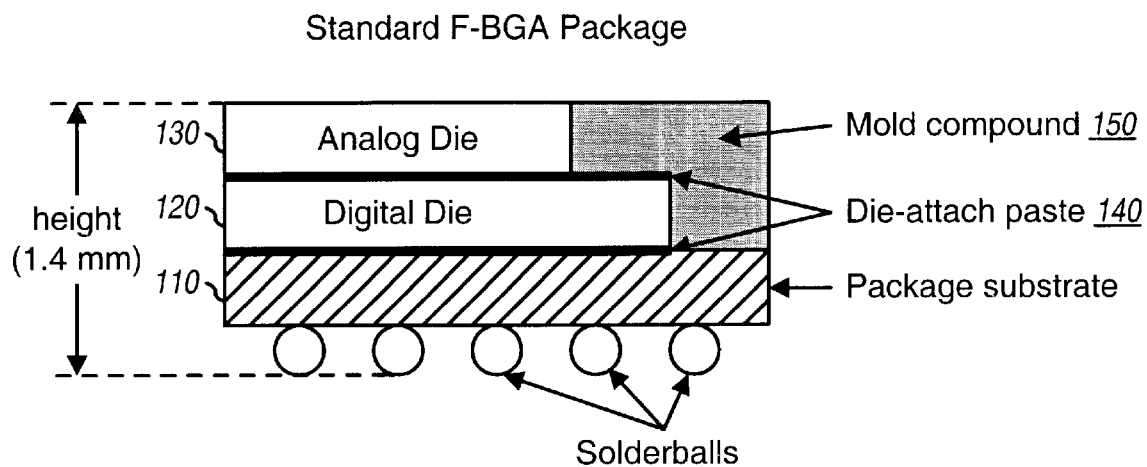
FIG. 2 is a diagram showing a side view of the mixed-signal IC, which is encapsulated within a particular IC package.

FIG. 2 is a diagram showing a side view of mixed-signal IC 100, which is encapsulated within a particular IC package. As shown in FIG. 2, a layer of die-attach paste 140 is spread on top of package substrate 110, and digital die 120 is then placed on top of the die-attach paste layer. A second layer of die-attach paste 140 is then spread on top of digital die 120, and analog die 130 is placed on top of the second die-attach paste layer. The die-attach paste layers are used to attach (i.e., "glue") the dies and package substrate together. A mold compound 150 may be used to fill the empty space left by the analog and digital dies.

Mixed-signal IC 100 may be packaged using various types of packages. The specific package may be selected based on various factors such as the required number of pins, the preferred pin layout, manufacturability, and so on. In the example shown in FIG. 2, mixed-signal IC 100 is packaged in a commercially available, standard fine ball grid array (F-BGA) package having the sizes and dimensions known in the art.

In an embodiment, to encapsulate mixed-signal IC 100 within a standard package having a defined height dimension, the thickness of analog die 130 and/or digital die 120 may be controlled to be within particular limits. The thickness of the analog and digital dies may be reduced by "back grinding" the wafers used to fabricate the dies. In an embodiment, the wafers are back grinded to 200 μm, although some other thickness values may also be used. By reducing the thickness of the analog and digital dies, the stacked dies may be made to have either (1) a profile similar to that of a monolithic die typically encapsulated in that package, or (2) a profile that conforms to the specifications for the package.

Figure 3A:
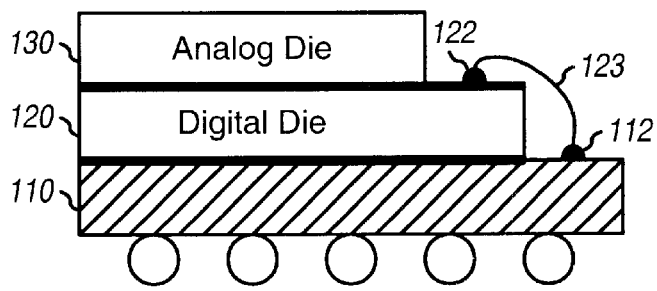
FIGS. 3A through 3C are diagrams showing side views of the interconnections between various layers of the mixed-signal IC.
Figure 3B:
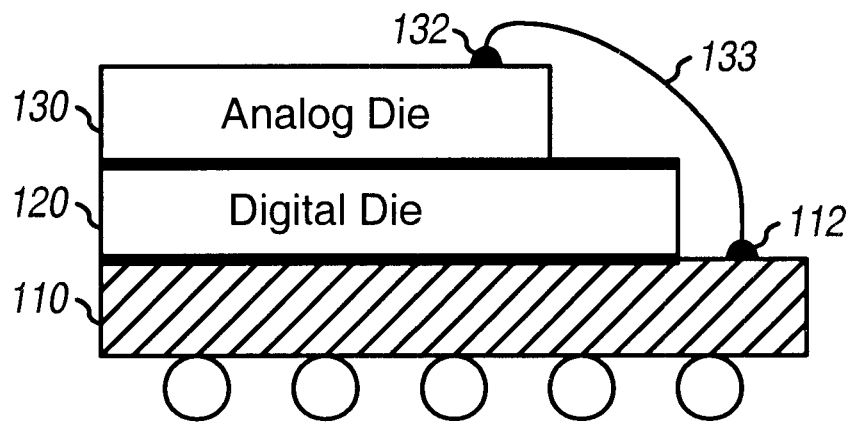
Figure 3C:
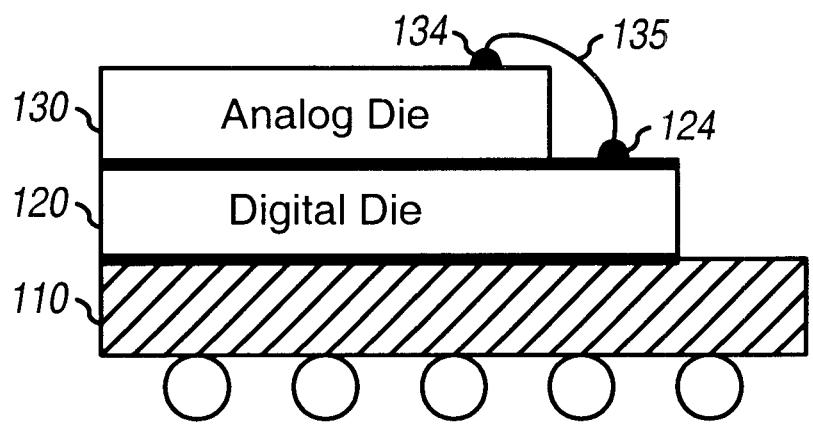

FIGS. 3A through 3C are diagrams showing side views of the interconnections between various layers of mixed-signal IC 100. FIG. 3A shows the interconnection between digital die 120 and package substrate 110. This interconnection is achieved via bonding pads 112 and 122, which are located respectively on the package substrate and the digital die, and bonding wire 123. This interconnection may be achieved in a manner normally used for that package.

FIG. 3B shows the interconnection between analog die 130 and package substrate 110. This interconnection is achieved via bonding pads 112 and 132, which are located respectively on the package substrate and the analog die, and bonding wire 133. This interconnection may also be achieved in a normal manner.

FIG. 3C shows the interconnection between analog die 130 and digital die 120. This interconnection is achieved via bonding pads 134 and 124, which are located respectively on the analog and digital dies, and bonding wire 135. This interconnection may also be achieved in a normal manner.

Figure 4A:
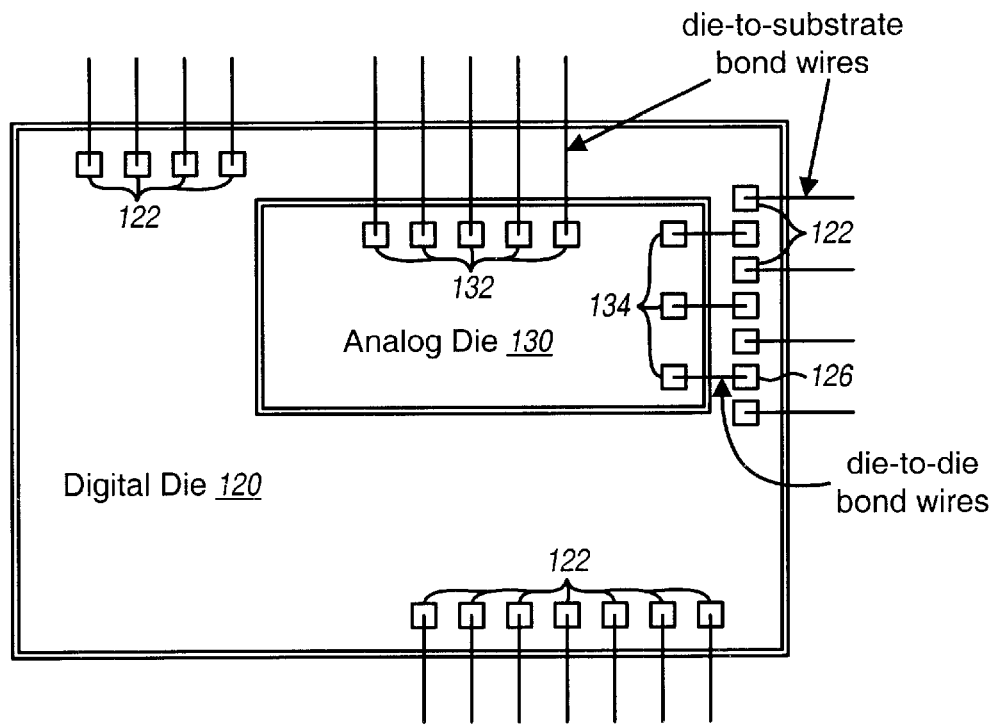
FIGS. 4A and 4B are diagrams showing top views of the interconnections between the analog and digital dies.
Figure 4B:
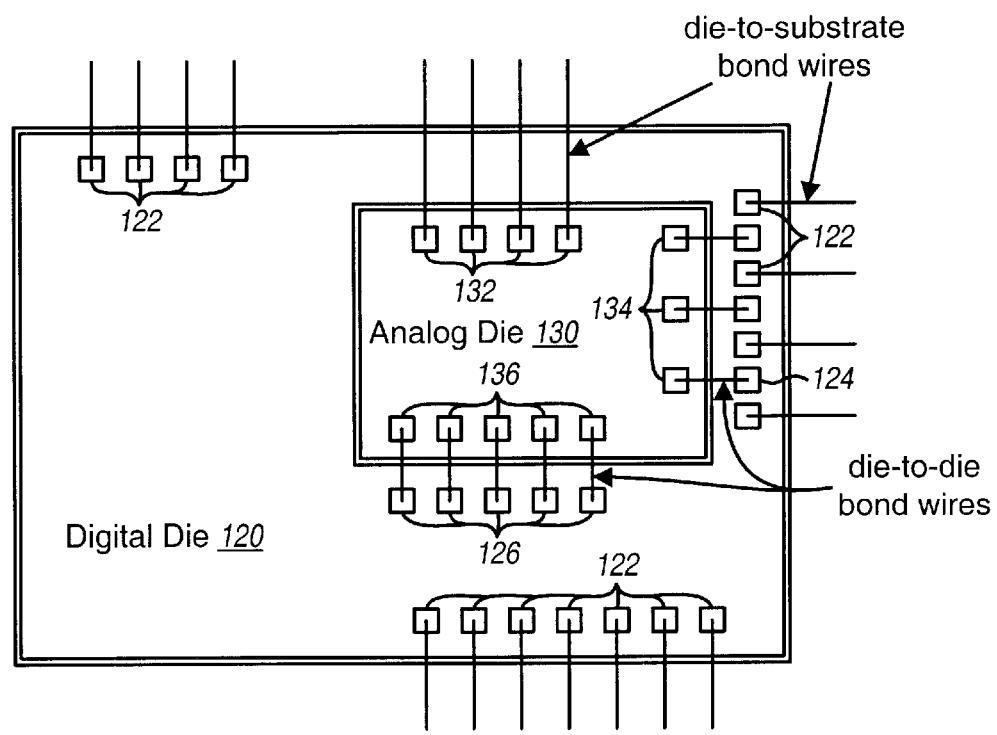

FIGS. 4A and 4B are diagrams showing top views of the interconnections between the analog and digital dies. In FIG. 4A, a first set of bonding pads 132 is provided on analog die 130 for interconnection with package substrate 110, and a second set of bonding pads 134 is provided for interconnection with digital die 120. Similarly, a first set of bonding pads 122 is provided on digital die 120 for interconnection with package substrate 110, and a second set of bonding pads 124 is provided for interconnection with analog die 130.

In one aspect, bonding pads 122 and 124 on digital die 120 are "inter-digitized", where possible, such that bonding pads 122 and 124 are alternatively located (along a line) on the digital die. With the inter-digitized bonding pad arrangement, minimal additional die area (if any) is required to implement the additional bonding pads 124 on digital die 120 to interconnect to analog die 130. In this manner, no penalty is incurred by stacking analog die 130 on top of digital die 120. Alternatively, a group of the die-to-die bonding pads, on digital die 120, may be placed between a group of external pins, on the digital die. No penalty is also incurred for this arrangement.

In an embodiment, bonding pads 132 and 134 for analog die 130 are located near the edges of the analog die, and close to the edges of digital die 120 and package substrate 110 to which the bonding pads are eventually coupled. This bonding pad placement facilitates the interconnection between analog die 130 and digital die 120 and package substrate 110 (e.g., to implement the inter-digitized connections). This also results in shorter bonding wires from analog die 130, which may improve performance. In an embodiment, bonding pads 122 and 124 for digital die 120 are also located near the edges of the digital die. This bonding pad placement for digital die 120 avoids intrusion into the digital circuit area. Placement of the bonding pads in the center area of the digital die may interfere with (i.e., block) the routing channel for signal lines.

FIG. 4B shows the interconnections between the analog and digital dies using bonding pads 126 located away from the edges of digital die 120. For some specific designs, it may be advantageous to interconnect to the digital circuits located away from the edges of the digital die. This may be required, for example, to shorten the interconnection between the analog and digital circuits or to provide more I/O pads on the analog die. In this case, bonding pads 126 may be provided on digital die 120 to interconnect with corresponding bonding pads 136 on analog die 130.

The stacked analog and digital dies described herein provide numerous advantages. First, by separating the analog and digital circuits into two dies, more optimal process technologies may be selected for each type of circuits. Different technologies may be selected for the analog and digital circuits. Second, noise coupling through a common silicon substrate is eliminated. Third, the analog and digital circuits can evolve at different schedules so that one circuit type (e.g., analog) does not hold up the design of the other circuit type. Moreover, each circuit type may be designed and revised without affecting the design of the other circuit type. Other benefits may also be realized with the stacked analog and digital die design described herein.

Another aspect of the invention provides techniques to test the stacked analog and digital dies. Each of the dies may be individually tested (e.g., at the wafer level) to ensure proper functionality of the circuits fabricated on the die. After the analog and digital dies have been stacked, interconnected, and encapsulated within a package, additional testing may be performed to ensure that the interconnections via the bond wires are functional (i.e., to ensure connectivity). However, since the die-do-die interconnections are not directly accessible via external pins, techniques are provided herein to test these interconnections.

In an embodiment, the die-to-die interconnectivity testing is achieved in conjunction with a standard serial bus interface (SBI), which operates in a manner known in the art. To implement this interface, the digital die may be designed and operated as a "master" driver that controls the test functions (e.g., power down, mode selection, and so on), and the analog die may be operated as a "slave" driver that implements the controls provided by the digital die. Test vectors comprising sequences of control values may be sent from the digital die to the analog die to perform the die-to-die testing.

In an embodiment, a multiplexer is provided on the analog die for each die-to-die interconnection to be tested. The multiplexer has a first input for normal operation, a second input for testing, an output that operatively couples to the die-to-die pad, and a control input. To test a read of a value from the analog die, the second input and control input respectively receive a test value and a control signal from the slave driver on the analog die, which can direct the multi-plexer to provide a particular test value via the multiplexer to the die-to-die pad. On the digital die, the test value from the analog die is received and may be routed to an external output pad (e.g., via another multiplexer). The test value may then be detected and compared against the value provided to the slave driver via the serial bus interface.

To test a write of a value to the analog die, a test value may be routed from an external output pad to a die-to-die pad on the digital die (e.g., via a multiplexer). The test value is then received by another multiplexer on the analog die. This multiplexer on the analog die may be controlled by the slave driver to route the received test value to the slave driver, which then provides the value on the serial bus interface. The test value provided via the digital die and the detected value from the serial bus interface may be compared to ensured proper connectivity.

The serial bus interface may thus be used to test both reading from and writing to the analog die. The serial bus interface is used to control the multiplexers on the analog die for testing die-do-die interconnectivity. The serial bus interface is also used to provide test values via the digital die to the analog die (for a write) and to retrieve test values received by the analog die via the die-do-die interconnections (for a read).

Another aspect of the invention provides techniques to control the circuits and/or power supplies on the analog die and possibly the digital die to converse power during a stand-by mode. A remote terminal in a wireless communication systems may be active and fully operational in certain time intervals, and turned off or placed in the stand-by mode in other time intervals to conserve power and extend operating life between battery recharges. In the stand-by mode, it is desirable to power down as many circuits as possible to reduce power consumption. However, powering down the circuits may still result in leakage current, which can shorten the operating life of the remote terminal. This leakage current may be eliminated by "collapsing" the power supplies (e.g., down to zero volts) provided to these circuits.

For a mixed-signal IC implemented in the manner described above, it is desirable to power down and/or collapse the power supplies to as many circuits as possible in the analog die while in the stand-by mode. The analog circuits on the analog die may consume a (relatively) large amount of current when active to provide the desired performance. The analog circuits may also operate on different voltages than that used for the digital circuits. For example, the analog circuits may operate from 3.3 Volts power supplies while the digital circuits may operate from 1.8 Volts power supplies. The power supplies for the analog die may be provided from an external source (e.g., a power management unit) via external pins.

In an embodiment, the serial bus interface is used to control the operation of some or all of the analog circuits and to collapse the power supplies during the stand-by mode. The slave driver on the analog die may be designed to operate based on a digital power supply, and is maintained operational throughout the stand-by period. Level shifting circuits are provided on the analog die to translate the digital control signals from the slave driver to the required signal levels needed to control various types of analog circuits on the analog die (e.g., oscillators, phase lock loop circuit, front-end receiver circuits, and so on). The slave driver receives commands from the digital die via the serial bus interface to control the operation of the circuits on the analog die. In response, the slave driver generates control signals that command the analog circuits on the analog die to operate in the prescribed manner. The slave driver is able to maintain the settings for the circuits because it is powered on even in the stand-by mode.

In the stand-by mode, the serial bus interface is used to direct the power management unit to collapse the voltages for selected circuits (all or a subset of the circuits) in the analog die. This eliminates leakage current and extends operating life. When not in the stand-by mode, the serial bus interface is used to direct the power management unit to bring up the voltages for the analog die.

The voltage "telescoping" techniques described herein, where the voltages for some or all of the circuits in the analog die are collapsed (e.g., to zero volts) in the stand-by mode, may also be applied to other mixed-signal designs in which the analog and digital dies are not stacked and may further be packaged in separate packages. The voltage telescoping techniques may also be applied to various (selective) blocks in the digital die.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit (IC) having a fist die in stacked configuration relative to a second die with the first and second dies comprised of predominantly digital circuits and analog circuits, respectively,
   the first and second dies including bonding pads coupled by die-to-die digital bond wires electrically connecting associated digital circuits thereof,
   the die-to-de digital bond wires providing routing channels arranged in a manner to optimize the length and position of the associated routing channel.

2. The IC of claim 1, wherein the bonding pads are arranged and located to minimize die area.

3. The IC of claim 2, further comprising a package substrate onto which the first and second dies are disposed.

4. The IC of claim 3, wherein at least one of the first and second dies include bonding pads and associated bond wires for electrically coupling to the package substrate.

5. The IC of claim 2, wherein the first and second dies are derived from a wafer having a thickness obtained by back grinding the wafer.

6. The IC of claim 2, wherein the first and second dies are fabricated of different IC process technologies.

7. The IC of claim 2, wherein the first die is fabricated of CMOS process technology.

8. An IC package including an encapsulated integrated circuit, the IC having a fist die in stacked configuration relative to a second die with the first and second dies comprised of predominantly digital circuits and analog circuits, respectively,
   the first and second dies including bonding pads coupled by die-to-die digital bond wires electrically connecting associated digital circuits thereof,
   the die-to-die digital bond wires providing routing channels arranged in a manner to optimize the length and position of the associated routing channel.

9. The IC package of claim 8, wherein the IC package is a ball grid array type package.

10. An IC having a package substrate and a first die in stacked configuration relative to a second die with the first and second dies comprised of predominantly digital circuits and analog circuits, respectively,
    the package substrate and the second die including bonding pads coupled by analog bond wires electrically connecting associated analog circuits thereof,
    the analog bond wires being arranged and located in a manner to minimize interference caused by any digital die-to-die bond wires connecting digital circuits.

11. The IC of claim 10, wherein the first and second dies are derived from a wafer having a thickness obtained by back grinding the wafer.

12. The IC of claim 10, wherein the first and second dies are fabricated of different IC process technologies.

13. The IC of claim 10, wherein the first die is fabricated of CMOS process technology.

14. An IC package including an encapsulated integrated circuit, the IC having a package substrate and a first die in stacked configuration relative to a second die with the first and second dies comprised of predominantly digital circuits and analog circuits, respectively,
    the package substrate and the second die including bonding pads coupled by analog bond wires electrically connecting associated analog circuits thereof,
    the analog bond wires being arranged and located in a manner to minimize interference caused by any digital die-to-die bond wires connecting digital circuits.

15. The IC package of claim 14, where the IC package is a ball grid array type package.

16. An IC having a first die in stacked configuration relative to a second die with the first and second dies comprised of predominantly digital circuits and analog circuits, respectively,
    the first and second dies having bonding pads providing electrical connection therebetween by associated die-to-die bond wires,
    at least one of said die-se bond wires operating as a digital serial interface providing commands from a digital circuit on the first die to a digital control circuit on the second die, the digital control circuit using the commands to control circuits on the second die.

17. The IC of claim 16, further comprising a package substrate onto which the first and second dies are disposed.

18. The IC of claim 17, wherein at least one of the fit and second dies include bonding pads and associated bond wires for electrically coupling to the package substrate.

19. The IC of claim 16, wherein the first and second dies are derived from a wafer having a thickness obtained by back grinding the wafer.

20. The IC of claim 16, wherein the first and second dies are fabricated of different IC process technologies.

21. The IC of claim 16, wherein the first die is fabricated of CMOS process technology.

22. The IC of claim 16, wherein the digital serial interface is a serial bus interface (SBI).

23. An IC package including an encapsulated integrated circuit, the IC having a first die in stacked configuration relative to a second die with the first and second dies comprised of predominantly digital circuits and analog circuits, respectively,
    the first and second dies having bonding pads providing electrical connection therebetween by associated die-to-die bond wires,
    at least one of said die-to-die bond wires operating as a digital serial interface providing commands from a digital circuit on the first die to a digital control circuit on the second die, the digital control circuit using the commands to control circuits on the second die.

24. The IC package of claim 23, wherein the IC package is a ball grid array type package.

25. The IC package of claim 23, wherein the digital serial interface is a serial bus interface (SBI).

26. An IC having a first die in stacked configuration relative to a second die with the first and second dies comprised of predominantly digital circuits and analog circuits, respectively, the first and second dies having bonding pads providing electrical connection therebetween by associated die-to-die bond wires, at least one of said die-to-die bond wires providing a signal from the first die for collapsing power to select circuits on the second die during standby mode while maintaining power to other circuits on the same die.

27. The IC of claim 26, further comprising a package substrate onto which the fist and second dies are disposed.

28. The IC of claim 27, wherein at least one of the first and second dies include bonding pads and associated bond wires for electrically coupling to the package substrate.

29. The IC of claim 26, wherein the first and second dies are derived from a wafer having a thickness obtained by back grinding the wafer.

30. The IC of claim 26, wherein the first and second dies are fabricated of different IC process technologies.

31. The IC of claim 26, wherein the first die is fabricated of CMOS process technology.

32. An IC package including an encapsulated integrated circuit, the IC having a first die in stacked configuration relative to a second die with the first and second dies comprised of dominantly digital circuits and analog circuits, respectively, the first and second dies having bonding pads providing electrical connection therebetween by associated die-to-die bond wires, at least one of said die-to-die bond wires providing a signal from the first die for collapsing power to select circuits of the second die during standby mode while maintaining power to other circuits on the same die.

33. The IC package of claim 32, wherein the IC package is a ball grid array type package.

* * * * *